(12) United States Patent
Cuthbert et al.

(10) Patent No.: US 6,168,904 B1
(45) Date of Patent: *Jan. 2, 2001

(54) INTEGRATED CIRCUIT FABRICATION

(75) Inventors: John David Cuthbert, Orlando, FL (US); Chong-Cheng Fu, Austin, TX (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/939,422

(22) Filed: Sep. 29, 1997

(51) Int. Cl.⁷ .................................................. G03C 5/00
(52) U.S. Cl. ...................... 430/312; 430/311; 430/394; 430/396
(58) Field of Search .................................. 430/311, 312, 430/394, 396

(56) References Cited

U.S. PATENT DOCUMENTS 5,604,059 * 2/1997 Imura ....................................... 430/5

* cited by examiner

Primary Examiner—Kathleen Duda
(74) Attorney, Agent, or Firm—Anthony Grillo; John T. Rehberg

(57) ABSTRACT

An improved method of integrated circuit fabrication is described with a photolithographic step involving pattern decomposition. A desired final pattern is decomposed into two or more component patterns for photoresist imaging, leading to improvements in image fidelity.

18 Claims, 8 Drawing Sheets

INTEGRATED CIRCUIT FABRICATION

TECHNICAL FIELD

This invention relates generally to the field of integrated circuit fabrication and particularly to lithographic techniques used in such fabrication which reduce optical proximity or truncation effects.

BACKGROUND OF THE INVENTION

The development of integrated circuit manufacturing has required developments in many technical areas. Many of these developments have focused on fabricating devices or features with smaller dimensions than previously used or on fabricating devices or features closer together than previously possible. Smaller dimensions permit the fabrication of more devices or other integrated circuit components per unit substrate area. Closer spacing of features yields similar advantages.

Integrated circuit fabrication has a plurality of steps in which a pattern is transferred from a mask to the wafer or substrate. The wafer is coated with a radiation sensitive material termed a resist which forms an overlying layer on the wafer or substrate. The pattern is transferred from the mask to the wafer by, for example, an optical imaging system and exposing the mask to radiation. Only selected portions of the mask transmit radiation and, therefore, only selected portions of the resist are exposed to radiation. When the resist is exposed to a suitable agent, the radiation changes the relative removal rates during development of the exposed and unexposed portions of the resist. After the resist has been patterned by removal of the selected portions to expose the underlying material, the now-exposed underlying material is modified by, for example, etching to remove material, or ion implanting to change the electrical characteristics of the material.

An example that demonstrates the problems that arise as features are reduced in size or are packed closer together near the limits of the imaging system will be discussed using a common component namely, field effect transistors, of integrated circuits. Field effect transistors have a gate structure which controls carrier flow through a channel located underneath the gate and extending from the source and drain regions located on opposite sides of the gate structure. The conducting portion of the gate structure is separated from the channel by a gate oxide. The conducting portion of the gate structure should completely cover the gate oxide; that is, the ends of the conducting portion of the gate structure should not expose the gate oxide. Due to the high spatial frequencies needed to accurately replicate the corners of the gate structure, rounding of the gate structure occurs because the higher spatial frequencies do not pass through a lens of finite numerical aperture (N.A.). When the gate structure becomes too small, truncation (or shortening) of the gate structure is observed. A proper compensation for this truncation effect requires that the gate structure be fabricated with a design dimension longer than the extent of the gate oxide. Consequently, more substrate area is used because features proximate the end of the gate structure must be moved away so that a minimum spacing to the proximity feature is maintained during pattern transfer to the resist.

The comment in the previous paragraph about the relationship between spatial frequencies and feature dimensions will be better understood from consideration of the following. Only those portions of the mask image that are transmitted through the lens that is positioned between the mask and the substrate will be reproduced in the resist. However, as features become smaller or more closely spaced, the spatial separation between the light in different diffraction orders comprising the image increases. Only lower diffraction orders are transmitted through the projection lens due to the finite numerical aperture of the lens. The information about the image contained in the higher orders is thus lost. The lens may be considered a low pass optical frequency filter which truncates at some frequency. In other words, only frequencies below a certain value are transmitted. The attainable resolution; that is, the smallest feature dimension or spacing that can be printed, is thus limited because the higher spatial frequencies are lost.

A typical lithographic process uses only a single exposure of the resist to radiation, however, double exposures have been used. See, for example U.S. Pat. No. 4,788,117, issued on Nov. 29, 1988 to Cuthbert et al. In this example, double exposures were used to provide a non-destructive means of generating a cross section of a photoresist feature to facilitate the examination of the feature.

SUMMARY OF THE INVENTION

This invention relates to a method of integrated circuit fabrication which has at least one photolithographic process step involving pattern decomposition where a mask pattern is decomposed into at least two component parts. Lithographic processing using less complex component patterns leads to a reduction of truncation and proximity effects in the final desired pattern. This pattern decomposition technique can be used either with positive or negative resists. A two-step double exposure technique allows the desired final pattern to be reproduced with sharper corners or better line size control than the conventional single exposure approach. This technique can be extended to include multi-step exposures with two or more reticle patterns. In a preferred embodiment, the subsequent exposures are performed without prior processing of the resist. Closely spaced or narrow features can be produced with improved image fidelities using this technique.

DETAILED DESCRIPTION

Figure 1:
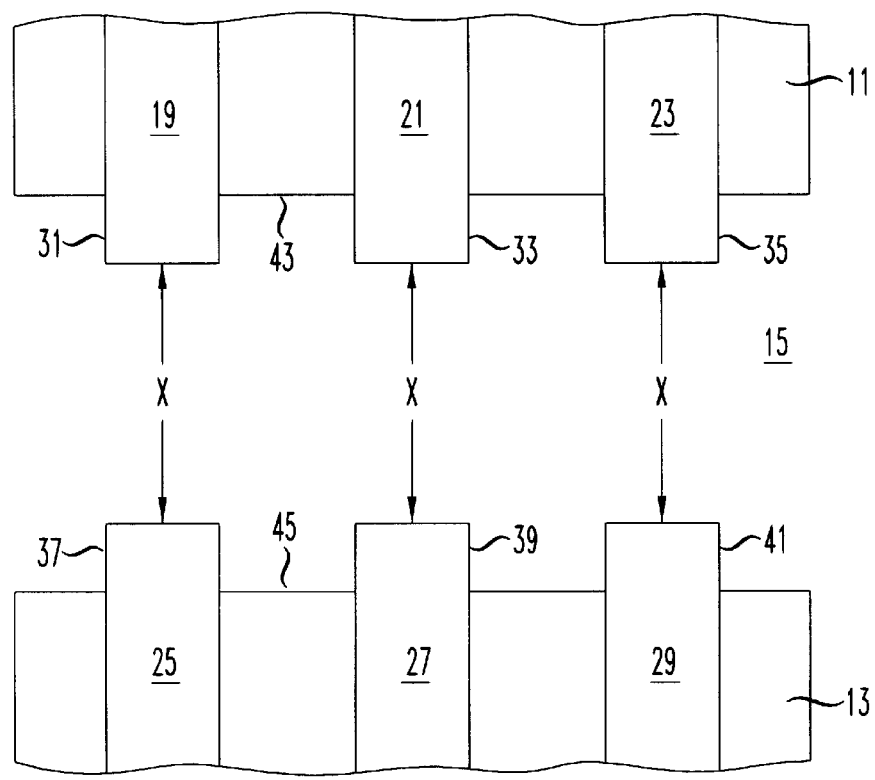
FIG. 1 is a top down view of a portion of an integrated circuit illustrative of desired gate structures.

FIG. 1 is a top down or plain view of a portion of an integrated circuit (IC) as formed in silicon, without regard to proximity effects. For simplicity, this view of the IC pattern in silicon will be treated as interchangeable with the image in the photoresist, assuming negligible distortions from subsequent pattern transfer such as an etching step. Reference numerals 11 and 13 indicate gate oxide regions or thin oxide regions, also sometimes termed "thinox" regions. Reference numerals 19, 21, 23, 25, 27, and 29 denote conductive gate structures (herein after "gates") which may, illustratively, be polysilicon. Reference numeral 15 denotes a field oxide region. It will be noted that ends 31, 33, and 35 of gates 19, 21, and 23 respectively protrude slightly beyond boundary 43 of gate oxide region 11. Similarly, ends 37, 39, and 41 of gates 25, 27, and 29 respectively, protrude somewhat beyond boundary 45 of gate oxide region 13. The protrusions are designed to allow for normal variations in line width control (without consideration of truncation) and in alignment precision of the poly pattern relative to the pattern to form the gate oxide regions 11 and 13. In order to maintain precise control of current flow beneath each of the above-described gates, it is important that the full width of the gates 19, 21, 23, 25, 27, and 29 extend over the associated gate oxide regions 11 and 13 (i.e. that ends 31, 33, 35, 37, 39 and 41 not be rounded so much that the respective gates 19, 21, 23, 25, 27, and 29 do not extend at least to boundaries 43 and 45 with full gate width).

Figure 2:
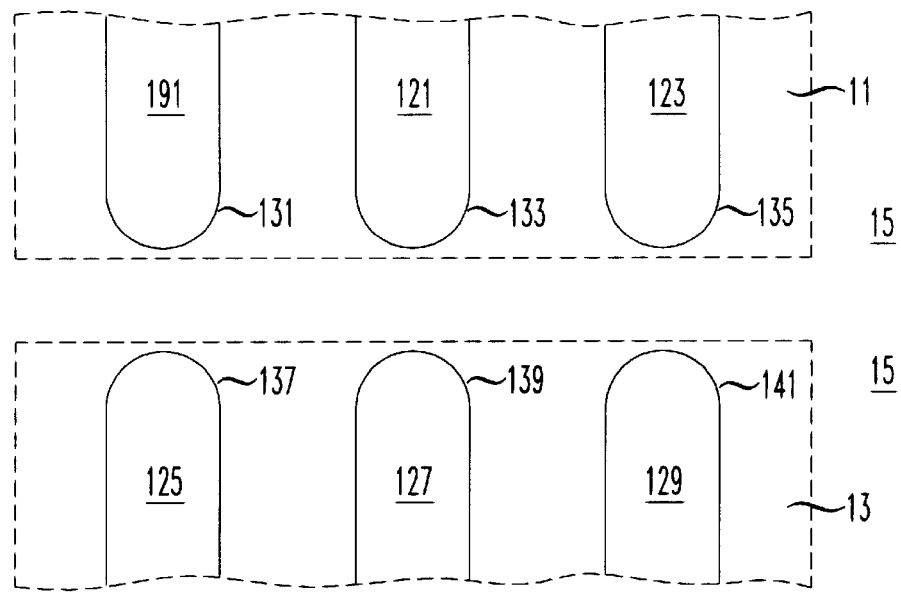
FIG. 2 is a top down view of the structure in FIG. 1 after patterning with truncation effects.

Unfortunately, although the result depicted in FIG. 1 may be desirable, actual practice in submicron IC fabrication often produces a result similar to that depicted in FIG. 2. FIG. 2 is also a top down or plain view of a portion of an integrated circuit as patterned in photoresist. Reference numerals 11 and 13 denote gate oxide regions while reference numeral 15 denotes a field oxide region. If the widths of the gates are on the order of magnitude of the actinic wavelength, image distortions like those in FIG. 2 may result from a conventional lithographic approach using a practical image transfer system. It will be noted in FIG. 2 that ends 131, 133, and 135 of gates 191, 121, and 123 respectively barely protrude beyond boundary 43 of gate oxide region 11. Consequently, gates 191, 121, and 123 are inferior to gates 19, 21, and 23 of FIG. 1 in terms of precise current control. Similarly, ends 137, 139, and 141 of gates 125, 127, and 129 respectively are somewhat rounded and barely protrude beyond boundary 45 of gate oxide region 13. Similarly, gates 125, 127, and 129 exhibit poorer performance than their counterparts, gates 25, 27, and 29 of FIG. 1.

These image distortions i.e., corner rounding or line size reduction, become significant when the desired image resolution is comparable to that of the illuminating wavelength. For a given image transfer system with numerical aperture NA, the resolution (d) of a pattern to be formed is related to the actinic wavelength ($\lambda$) by the equation: $d=(k\lambda)/NA$, where k is an adjustable numerical factor related to the imaging and resist systems. For current I-line ($\lambda$=365 nm) and deep ultraviolet (DUV) ($\lambda$=248 nm) lithographic processes, exemplary values for these parameters are: k~0.5 and NA~0.55. As device geometries shrink, these image distortions increasingly impact on the IC device performance or reliability. Improvement in image fidelities are therefore desirable for submicron processes, especially those employing I-line or DUV lithography. Further, the decomposition process may be utilized to simplify the use of phase shifting reticles in lithography.

The following discussion illustrates how, by the use of at least two separate reticles, the desirable pattern of FIG. 1 may be obtained and the undesirable pattern of FIG. 2 may be avoided.

Figure 3:
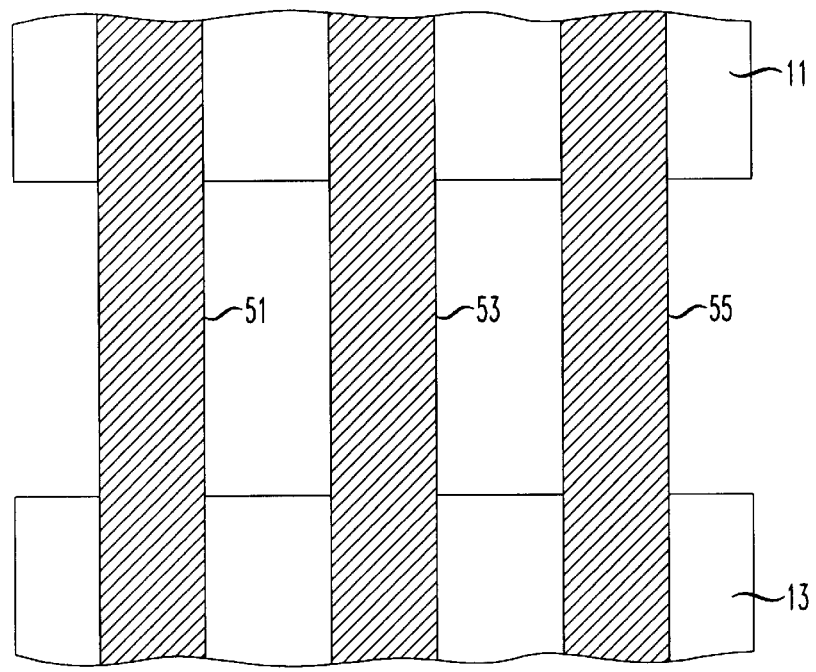
FIG. 3 is a diagrammatic representation of a portion of a first reticle pattern which can be used to produce a part of the desirable structure illustrated in FIG. 1.

FIG. 3 is a diagram which represents a portion of one of two reticle patterns which may be utilized to produce the desirable structure depicted in FIG. 1. It is assumed that the reticle depicted in FIG. 3 is employed together with a positive resist. In a positive photoresist, the photoresist material which is exposed to the actinic radiation suffers chemical changes which cause it to develop in developer solution and which may be later washed away. Gate oxide regions 11 and 13 are shown in phantom on the diagram of FIG. 3 for reference although they are not physically present on the reticle.

Thus, to make the structure of FIG. 1, a reticle having, for example, vertical chromium patterns denoted by reference numerals 51, 53, and 55 is properly aligned over a substrate which is coated with a positive resist. The resist is exposed to actinic radiation. Other materials, known to those skilled in the mask-making art, may be used instead of chromium.

Figure 4:
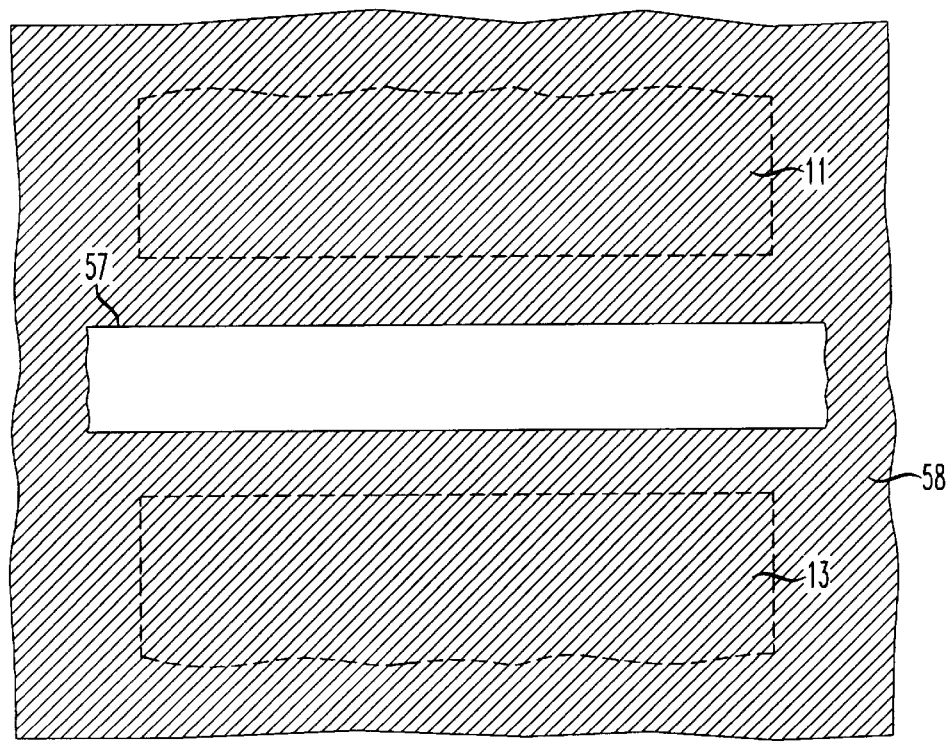
FIG. 4 is a diagrammatic representation of a portion of a second reticle pattern used to produce a part of the desirable structure illustrated in FIG. 1.

Next, a second reticle employing the design depicted in FIG. 4 is employed. Again, gate oxide regions 11 and 13 are represented in phantom for reference to highlight the alignment of reticles 3 and 4.) The reticle of FIG. 4 has a blank horizontal bar 57 formed illustratively in a field of chromium 58. The same substrate, coated with the same positive resist is exposed through the reticle of FIG. 4 to actinic radiation. The second exposure using the second reticle of the positive resist may be performed prior to developing the positive photoresist after the first exposure using the first reticle.

Exposure of the resist to actinic radiation through the reticle depicted in FIG. 4 serves to expose portions of the resist which were previously beneath vertical chromium patterns 51, 53 and 55. Thus, the second exposure, effectively serves to cut or separate chromium patterns 51, 53, and 55, thereby producing in the resist a pattern corresponding to the pattern depicted in FIG. 1. In other words, use of the first and second reticles shown respectively in FIGS. 3 and 4 enables one to produce in the resist and subsequently in the underlying patterned material, a gate pattern similar to that depicted in FIG. 1. This process avoids formation of a gate pattern similar to that depicted in FIG. 2 by using a lens which can only pass spatial frequencies up to a certain limit. It is understood that this pattern decomposition technique entails a proper alignment of the respective reticles prior to individual exposing steps. The subsequent exposure step should preferably be performed after the first step without developing the resist, or removing the wafer substrate from the optical imaging system. However, the practice of this invention does not preclude any wafer re-alignment, which may be necessary for certain optical imaging systems, between the exposure steps.

If one were to attempt to produce the desired pattern of FIG. 1 with a single reticle, one would need a projection system capable of transmitting the comparatively high spatial frequencies associated with corners, for example, corner 30 shown in FIG. 1. Thus, a projection lens having a very high NA or operating at a very short wavelength is needed. In contrast, by using two reticles similar to those depicted in FIGS. 3 and 4, a projection lens capable of transmitting comparatively lower spatial frequencies associated with linear features (as distinct from corners) may be used to avoid the undesirable rounding and distortion shown in FIG. 2. From a practical viewpoint, a projection lens operating at either a longer wavelength and/or smaller NA is more readily available than one operating at a shorter wavelength and larger NA.

This can be understood by considering the diffraction of partially-coherent light used to illuminate an object, such as a reticle pattern. Information required to reconstruct the image is contained in the diffracted light. In general, the amount of light diffracted into the higher orders (i.e. larger angles) increases with pattern complexity. Pattern complexity includes the size of an object feature and its shape. The larger the number of edges per unit area, the higher the complexity. A corner, for example, diffracts more strongly into the higher orders than does a straight line. Alternatively, this can be thought of as having a pattern represented by its Fourier components. A more complex pattern such as a corner, has more higher spatial frequency components than a relatively simple pattern, e.g. a straight line.

Therefore, a straight line extending completely across the reticle has lower associated spatial frequencies than a truncated line. By analogy, a DC signal of theoretically infinite extent has a lower frequency spectrum than a DC signal which abruptly terminates. The abrupt termination requires representation by comparatively higher Fourier components.

When analyzing two dimensional reticle features, closely spaced parallel features have corresponding higher spatial frequencies than parallel features which are spaced further apart.

In order to faithfully reproduce an object in the image plane of a projection system, all the diffracted light should be collected by the lens or image transfer system. However, a typical image transfer system has a finite numerical aperture (NA) which limits the light that can be collected to within a certain cone angle. This cone angle, $\alpha o$, is related to the numerical aperture by the equation $NA = n \sin \alpha o$, where n is the refractive index in image space; and $\alpha o$ is the maximum cone angle of rays reaching the lens from the object point (reticle). Light outside of an angle greater than $2\alpha o$ will not be collected by the lens. That is, the lens essentially acts as a low pass filter, cutting off some higher order diffracted light. The information contained in the higher spatial frequencies associated with the reticle pattern is therefore lost.

This results in several deleterious effects, among which are degradation of the intensity gradients of light at the image plane, rounding of sharp corners, shortening of line features, as well as or line size deviations from proximity effects.

In general, improvement in the pattern fidelity can be achieved by means of this pattern decomposition technique, whereby a complex pattern can be decomposed into two or more patterns with lower complexities. Faithful reproduction of the less complex pattern does not require the collection of the higher order diffracted light associated with the more complex composite pattern. A high fidelity image of the composite pattern can therefore be obtained by sequential exposures or printing using the respective decomposed patterns.

The pattern of FIG. 1 may also be implemented using two reticles and a negative resist. Reticles having designs similar to those depicted in FIGS. 5 and 6 may be utilized. Illustratively, the first reticle, shown in FIG. 5, has clear spaces 119, 121 and 123 in chrome field 1000 through which actinic radiation will expose the resist, making it insoluble during subsequent development. This undeveloped resist may be employed to etch features similar to gates 19, 21 and 23 respectively shown in FIG. 1. A second reticle, similar to that depicted in FIG. 6, may be employed to create the bottom half of the pattern. The reticle of FIG. 6 has clear spaces 126, 127 and 129 in chrome field 1001 through which actinic radiation will expose photoresist and then enable the creation of gates 25, 27, and 29 respectively shown in FIG. 1. Gate oxide regions 11 and 13 are shown in phantom in FIGS. 5 and 6.

This particular approach minimizes the problem shown in FIG. 2 in a way which is different from using positive resist. By decomposing the desired final pattern, shown in FIG. 1, into its component patterns in FIGS. 5 and 6, the relative separations between ends 131–133 and 134–136 on the reticles are no longer constrained by any minimum design rule. Instead, any undesirable gate length deviations, such as truncation or similar effects, can be compensated for by properly designing the individual component patterns. These reticle compensations will result in a final resist pattern where the gates extend sufficiently beyond the thinox boundaries to ensure reliable device performance while maintaining a desired minimum separation between the ends 143–145 and 146–148. The proper reticle compensations for these line size deviations can be obtained by simulation techniques, or preferably, by direct measurements using test wafers under the lithographic/resist processing conditions of interest. Empirical experimental approaches are typically known to those skilled in the art of photolithography.

Figure 5:
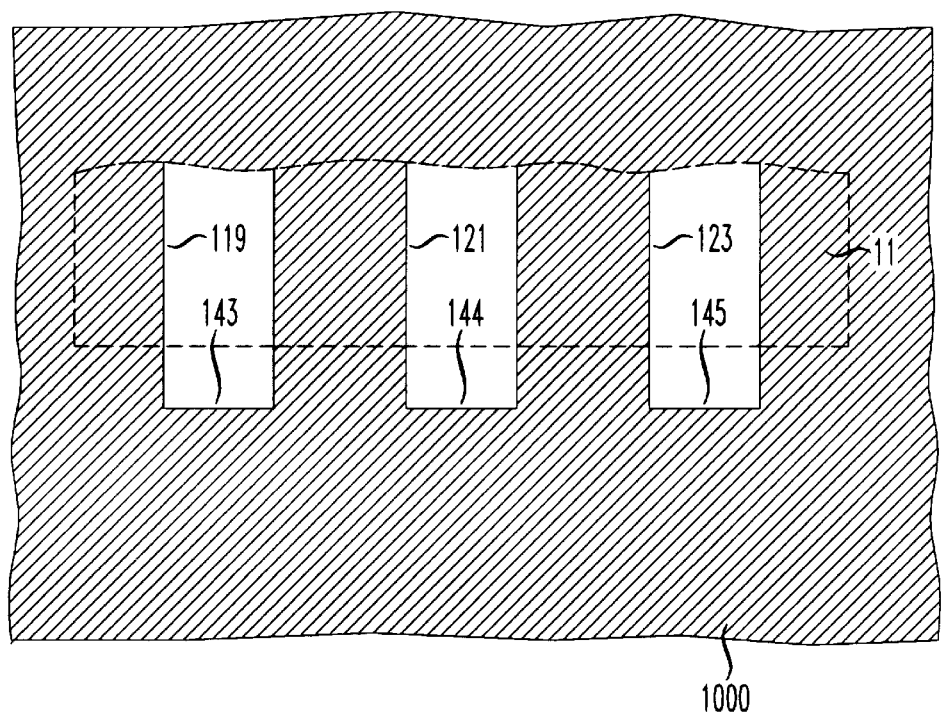
FIG. 5 is an illustration of a portion of a reticle which may be used with a negative resist to produce one part of the desired structure in FIG. 1.
Figure 6:
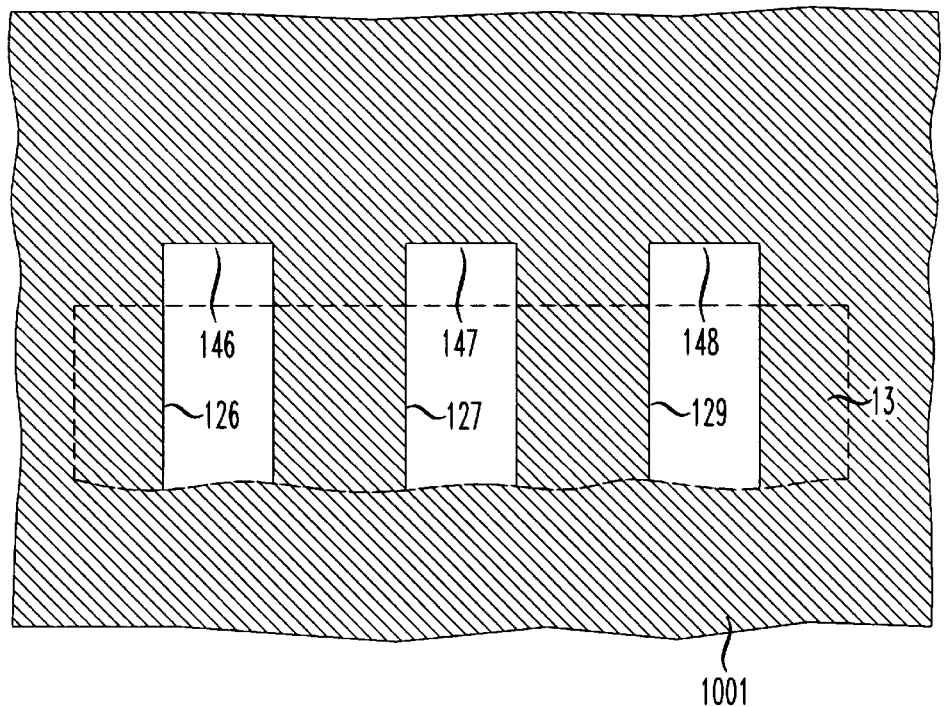
FIG. 6 is an illustration of a portion of a second reticle which may be used with a negative resist to produce another part of the desired structure in FIG. 1.

Each of the reticles depicted in FIGS. 5 and 6 has generally lower frequency components than one single reticle which combines the features of FIGS. 5 and 6 because each of these component patterns is less complex than the desired final pattern. It will be noted, however, that clear spaces 119, 121, and 123, for example, have truncated ends denoted by reference numerals 143, 144, and 145 respectively. By comparison, the reticles of FIGS. 3 and 4 do not contain so many closely spaced truncated ends, and have generally lower spatial frequency components than the reticles of FIGS. 5 and 6. Consequently, processes utilizing the reticles of FIGS. 3 and 4 (suitable for a positive resist) may be expected to produce sharper corners, such as those depicted in FIG. 1, than is possible with the reticles of FIGS. 5 and 6 (which are suitable for a negative resist).

Other combinations or additional reticle patterns may be used in a similar fashion to print additional features in a more complex pattern. For example, a third exposure step may be used with another simple reticle pattern consisting of a horizontal bar opening to print a runner perpendicular to and between the ends of the two sets of gates shown in FIGS. 5 and 6. The use of this additional reticle will allow the gates to be printed in close proximity to this runner while minimizing proximity effects.

Figure 7:
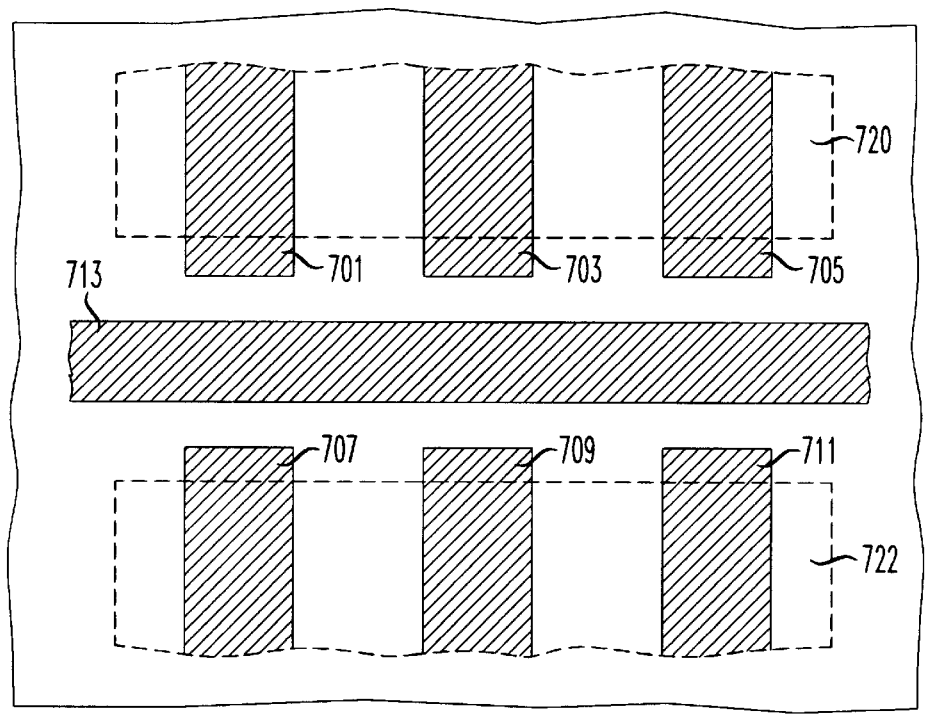
FIG. 7 is a top down view of a portion of an integrated circuit illustrative of desired gate structures.
Figure 8:
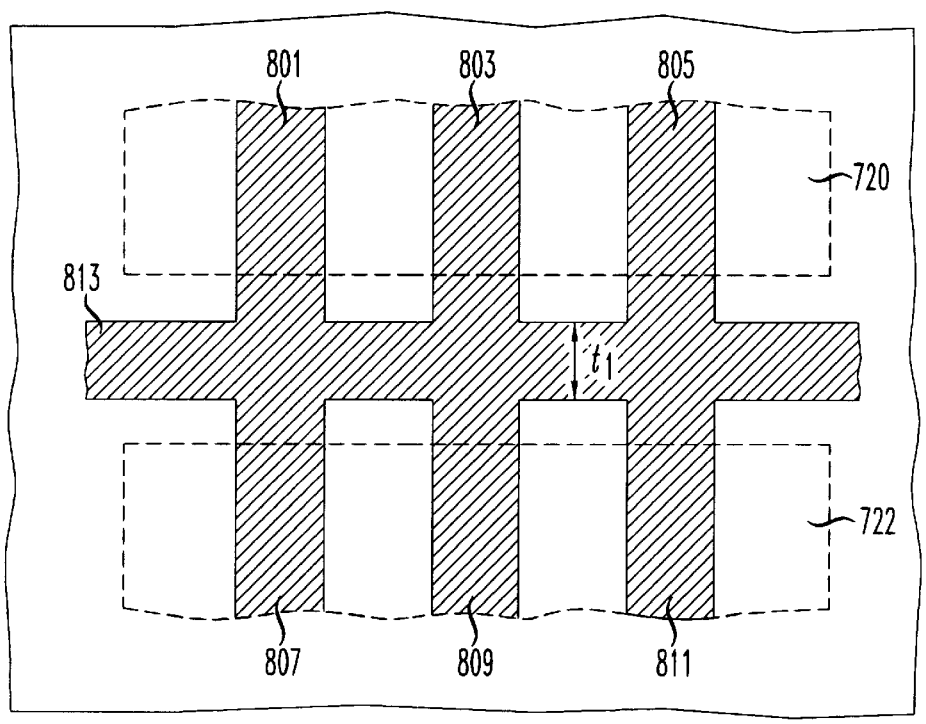
FIG. 8 is a diagrammatic representation of a portion of a first reticle pattern which can be used to produce a part of the desirable structure illustrated in FIG. 7.
Figure 9:
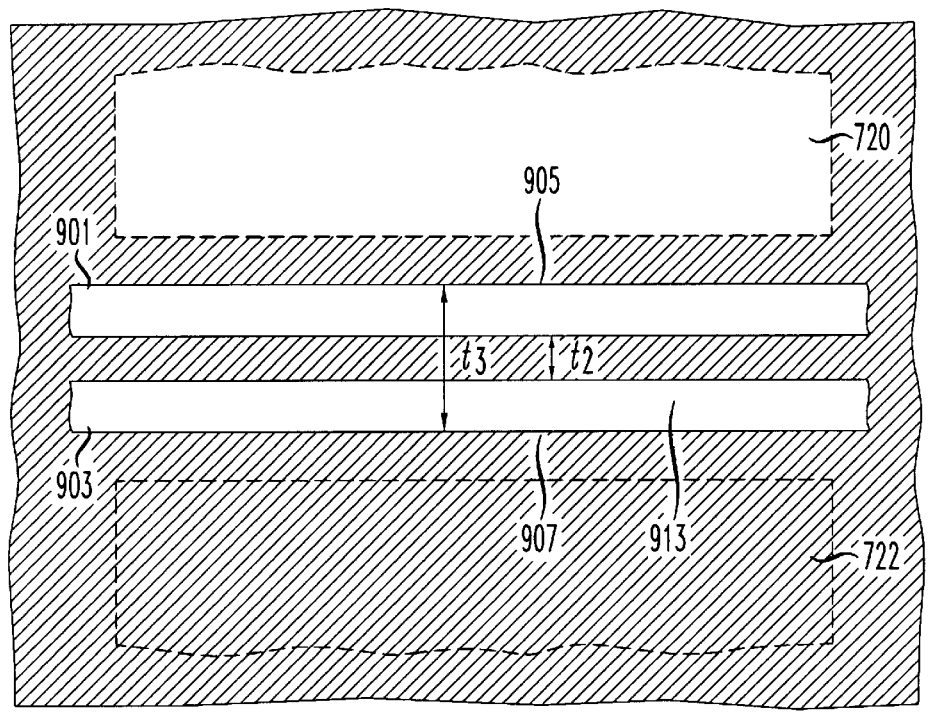
FIG. 9 is a diagrammatic representation of a portion of a reticle pattern which can be used to produce a part of the desirable structure illustrated in FIG. 7.

FIGS. 7–9 illustrate how a gate pattern in FIG. 7 can be obtained by using a positive resist and two reticles shown in FIGS. 8 and 9. FIG. 7 shows desired gate features 701, 703, 705, 707, 709 and 711; and 713 is a runner located between the ends of these gate features. 720 and 722 are thinox regions formed in the substrate by earlier IC process steps. If one were to print a pattern illustrated in FIG. 7 using a single exposure step with only one reticle pattern, linewidth and gate length reduction or corner rounding may result from proximity and truncation effects. These undesirable effects can be avoided by using two component patterns shown in FIGS. 8 and 9. Note that thin oxide regions 720 and 722 are shown in phantom for reference purposes only, and are not actual features on the reticle patterns. These two reticles can be used with a positive resist to generate the final desired pattern in FIG. 7. FIG. 8 shows a solid pattern which corresponds to a portion of the mask blocking the actinic radiation. The vertical portions 801, 803, 805, 807, 809 and 811 will eventually result (after a second exposure step) in the formation of portions of gate features 701, 703, 705, 707, 709, and 711 shown in FIG. 7. This reticle can be used in a first exposure step, followed by a second exposure (with proper alignment) using a reticle pattern shown in FIG. 9. The reticle pattern in FIG. 9 has two open portions denoted by 901 and 903, which are separated from each other by a solid portion 913. This 913 portion should be slightly narrower (in the vertical direction as illustrated) than the portion 813 in FIG. 8, i.e., $t_2$ should be smaller than $t_1$; and aligned symmetrically in the vertical direction with respect to portion 813. Thus, portion 913 effectively defines, after the second exposure step, the runner 713 illustrated in FIG. 7. The distance between upper edge (905) of the open portion 901 and the lower edge (907) of the open portion 903, $t_3$, is larger than $t_1$. Therefore, the upper edge 905 and the lower edge 907 effectively define the ends of the gate features 701, 703, 705, 707, 709 and 711. Because the corners of these gate features 701, 703, 705, 707, 709 and 711 are formed by the intersection of straight edges in the reticle patterns used in the two exposure steps, they will exhibit minimal rounding compared to the conventional approach of using one exposure step with a single reticle pattern.

Note that FIG. 9 can further be decomposed into two reticle patterns-one consisting of an open feature similar to open portion 901, and the other consisting of a feature similar to open portion 903. A 3-step exposure using these two component reticles together with that in FIG. 8 may further enhance the image fidelity in the final resist pattern. Additional process flexibility may also be achieved. For example, a range of linewidths for the runner 713 may be accurately obtained by the relative positioning of the 901 and 903 features on the reticles.

Figure 10:
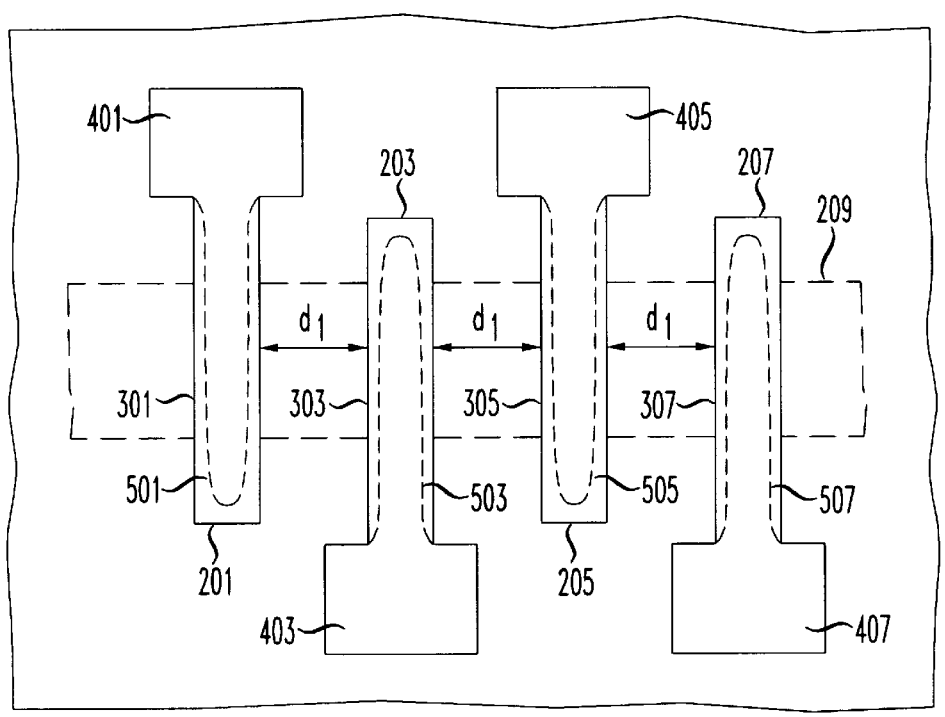
FIG. 10 depicts a top down view of another embodiment of the invention, illustrating the desired gate features and results from truncation and proximity effects.
Figure 11:
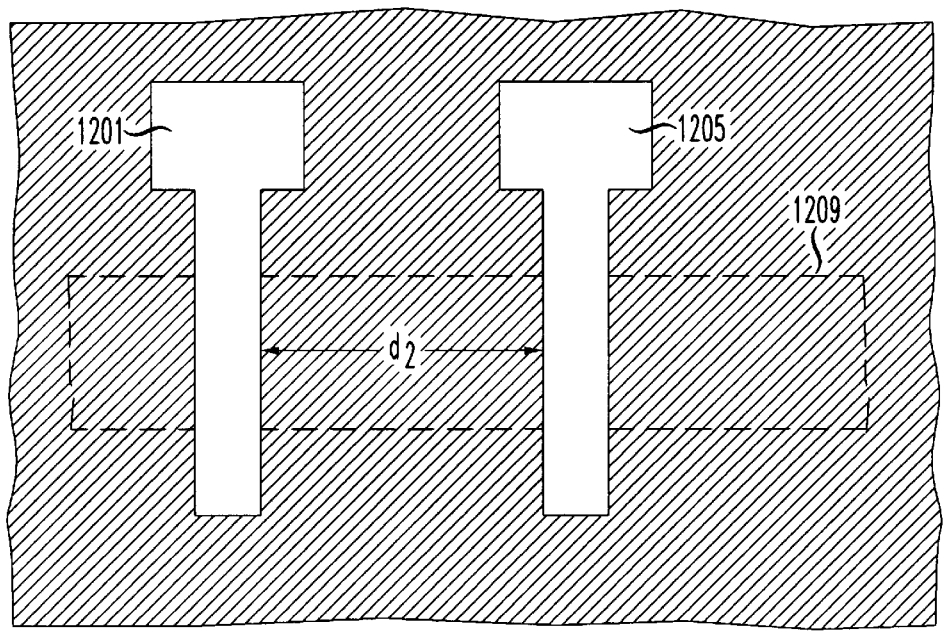
FIG. 11 illustrates a first reticle pattern which may be used with a negative resist to produce a portion of the desired structure shown in FIG. 10.
Figure 12:
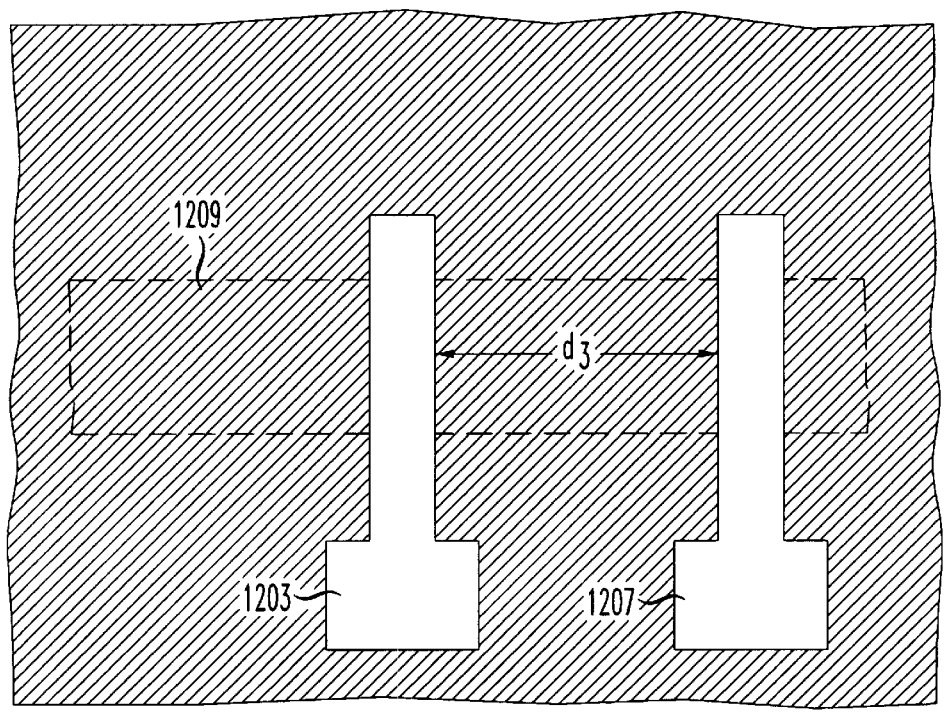
FIG. 12 illustrates a second reticle pattern which may be used with a negative resist to produce another portion of the desired structure shown in FIG. 10.

Another embodiment of the invention is illustrated in FIGS. 10, 11, and 12. FIG. 10 shows four generally parallel gates, 201, 203, 205, and 207 extending over thinox region 209. Each gate 201, 203, 205, and 207 has an elongated portion 301, 303, 305, and 307 respectively. Furthermore, each gate 201, 203, 205, and 207 has an attached rectangular portion 401, 403, 405, and 407 respectively. The rectangular portions 401, 403, 405, and 407 may be utilized to make contact with higher levels of metallization in the integrated circuit. If the gates 201, 203, 205, and 207 are spaced too closely together, conventional one-reticle processing may lead to each gate being made with linewidth deviations (proximity effect). Rounding of gate corners and reduction in gate lengths may also occur for narrow gate features. The phantom lines 501, 503, 505 and 507 illustrate the distorted gate shapes which may be typically obtained in actual practice. The exact deviations depend, of course on the resist type, exposure dosage and processing conditions. The rectangular portions 401, 403, 405, and 407, being characterized by generally lower spatial frequency components, are less severely affected and thus more faithfully reproduced.

These gate features with rectangular portions, e.g. 401 and 405, located on the same side of the thinox region 209, may be loosely described as being interdigitated. Illustratively, these gates are separated from each other by a spacing $d_1$; although in general, these spacings do not have to be equal to each other. For example, the spacing may be less than or equal to one (1) micrometer.

FIGS. 11 and 12 illustrate exemplary reticles which may be employed with a negative resist to produce the gate pattern of FIG. 10. In particular, the reticles of FIGS. 11 and 12 may be used to produce the desirable elongated portions 301, 303, 305, and 307 in FIG. 10 while minimizing gate width deviations due to proximity effects. After the wafer is coated with resist, first reticle of FIG. 11 is used to expose portions of photoresist through openings 1201 and 1205, which become insoluble in subsequent development. Thus, it is possible to pattern the resist after the second reticle exposure to create corresponding gates 201 and 205. Illustratively, openings 1201 and 1205 are separated from each other by a spacing d2. After the resist is exposed to actinic radiation through the reticle of FIG. 11, thereby creating the images of the gates 201 and 205 having rectangular portions 401 and 405 on the same side of thinox 209, a second exposure through a second reticle is then performed. The second reticle is depicted in FIG. 12. In the second exposure, radiation impinges upon the resist through openings 1203 and 1207, rendering these portions of the resist insoluble in a develop solution, so that subsequent development will produce gates 203 and 207. In both FIG. 11 and FIG. 12, a phantom region denoted by reference numeral 1209, corresponding to thinox region 209 is shown merely for reference and alignment purposes. Openings 1203 and 1207 are shown illustratively to be spaced apart at a spacing $d_3$ for this example. The linewidth control obtained by this two-step procedure using the simpler patterns in FIGS. 11 and 12 is superior to that obtained by using a single reticle alone.

The pattern of FIG. 10 can also be created using a positive resist in a two-step approach. Reticle patterns similar to FIG. 11 and 12 may be used (with reversal of the chrome and open areas), but adjustment of exposure to about half of the dosage will be needed for each exposure step. However, this arrangement may result in a diminished contrast in the printed features. Alternatively, reticles schematically depicted in FIGS. 13 and 14 can also be used, along with a positive photoresist.

Figure 13:
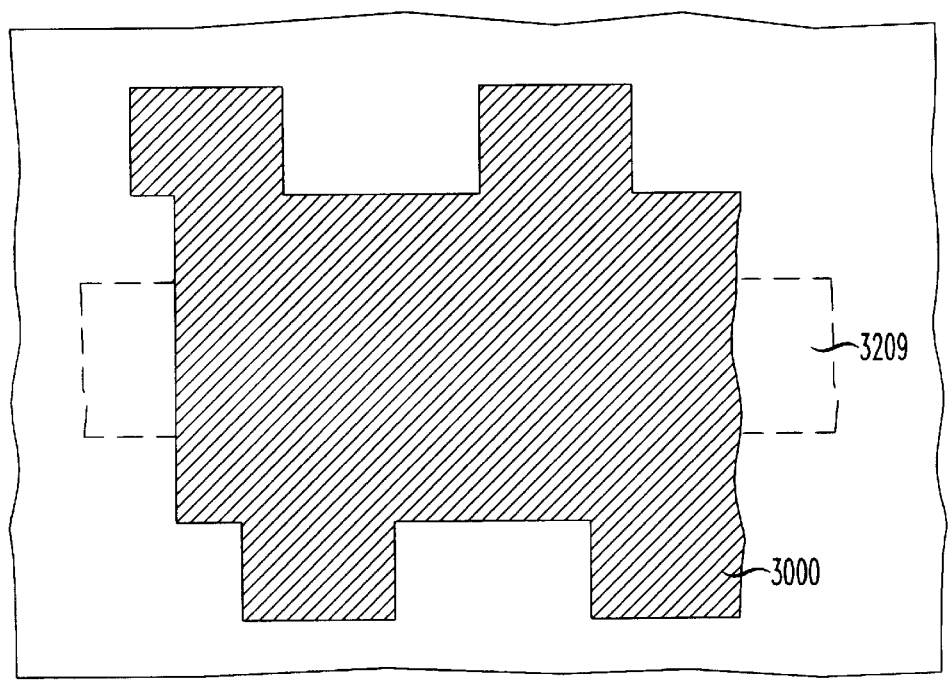
FIG. 13 illustrates the chrome pattern of a first reticle which may be used to produce an outline of the gate features shown in FIG. 10.
Figure 14:
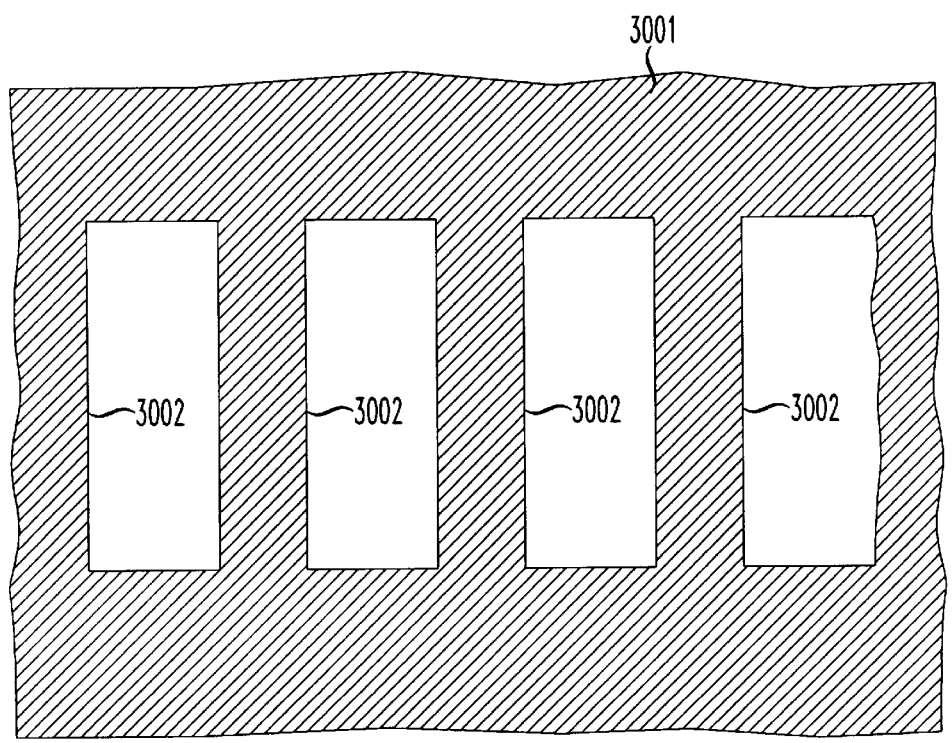
FIG. 14 illustrates the chrome pattern of a second reticle which may be used with a positive resist to produce portions of the features shown in FIG. 10.

The chrome pattern 3000 of the reticle of FIG. 13 corresponds to the outlines of all four gates 201, 203, 205 and 207 of FIG. 10 together with spaces between the respective gates. Reference numerals 3209 indicates the thinox region as a phantom reference. The reticle of FIG. 14 includes chrome pattern 3001 with cutout portions 3002, 3003, 3004, and 3005. Cutout portions 3002, 3003, and 3004 correspond to the spaces between the gates 201, 203, 205, and 207 of FIG. 10. Exposures using the reticle of FIG. 13 first and then the reticle of FIG. 14 permit the formation of a pattern in the positive resist which corresponds to the gate pattern of FIG. 10. Both the reticles of FIG. 13 and FIG. 14 have lower spatial frequency components than a single reticle having the pattern of FIG. 10. Consequently, use of the reticles of FIG. 13 and FIG. 14 avoids the undesirable linewidth deviations already discussed in connection with FIG. 10. If desired, further decomposition of the pattern in FIG. 14 may also be implemented to print cutout portions 3002 and 3004 in another step separate from cutout portions 3003 and 3005.

Figure 15:
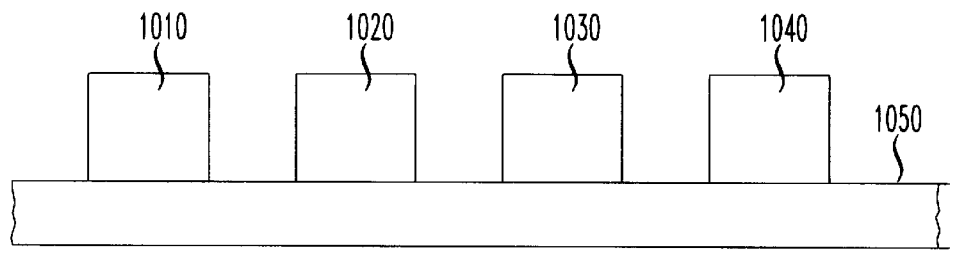
FIG. 15 shows a cross-sectional view of a desired pattern of closely spaced features over a substrate.
Figure 16A:
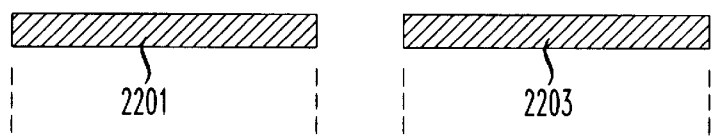
FIG. 16(a) shows a cross-sectional view of a reticle pattern which may be used with a positive resist to produce one portion of the desired structure shown in FIG. 15.
Figure 16B:
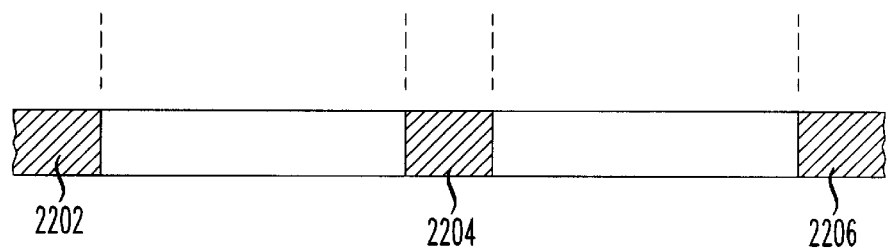
FIG. 16(b) shows a cross-sectional view of a photoresist exposed through the reticle of FIG. 16(a).
Figure 17A:
FIG. 17(a) shows a cross-sectional view of a second reticle pattern which may be used in conjunction with that in FIG. 16(a) to produce the pattern in FIG. 15.
Figure 17B:
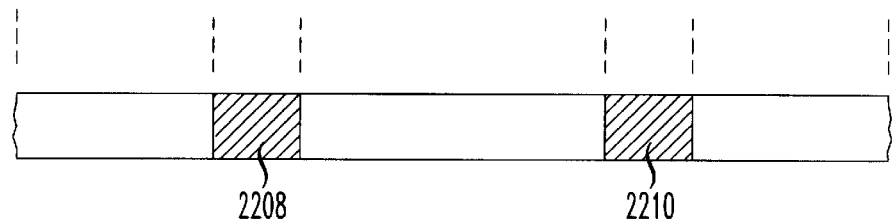
FIG. 17(b) shows a cross-sectional view of a photoresist exposed through the reticle in FIG. 17(a).

FIGS. 15–17 illustrates another pattern decomposition scheme using two fundamentally less complex patterns to create a closely-spaced structure with improved fidelity in a positive resist. FIG. 15 is a cross-sectional view of a desired pattern made up of closely spaced resist features 1010, 1020, 1030 and 1040 over a substrate 1050. A two-step exposure in a positive resist can be performed using the reticle pattern illustrated in the cross-sectional view in FIG. 16(*a*) followed by exposure using the reticle pattern shown in FIG. 17(*a*). In FIG. 16(*a*), reference numerals 2201 and 2203 indicate those portions of the reticle which are coated with chrome. FIG. 16(*b*) shows a cross-section of the positive photoresist, where 2202, 2204, and 2206 correspond to the portions exposed through the reticle of FIG. 16(*a*). In FIG. 17(*a*), reference numeral 2205, 2207 and 2209 indicate those portions of the reticle which are coated with chrome, while FIG. 17(*b*) illustrates the portions of the photoresist, 2208 and 2210, which are exposed through the reticle in FIG. 17(*a*). Portions of the positive resist which have not been shielded by the reticles of FIGS. 16(*a*) or 17(*a*) will be dissolved away in a subsequent developing step. Etching may be commenced to transfer the gate pattern of FIG. 15 to the underlying substrate.

Thus, the desired pattern of FIG. 15 is obtained by utilizing two reticles having patterns which are less dense and, consequently, have lower spatial frequency components, than that in FIG. 15. The image of FIG. 15 produced using this pattern decomposition technique will have less linewidth deviations from proximity effects compared to that obtained using a single reticle pattern.

After the pattern has been transferred to the resist, the resist is developed and other IC processing steps such as dopant implant or etching can continue. Of course, not all photolithographic patterning steps in the integrated circuit fabrication sequence need to follow this pattern decomposition approach. Those levels requiring critical dimension control will benefit most from this pattern decomposition method.

Although the above discussions have concentrated on application to gate features, the pattern decomposition technique can readily be applied to printing metal features as well. As geometries of metal features decrease, image infidelities may also cause undesirable results. The truncation of metal lines may, for example, lead to incomplete coverage of contact windows. This pattern decomposition technique can similarly be applied to these metal features to enable accurate printing and control of feature shapes and lengths, as well as metal linewidths. There is no inherent limitations precluding the application of this technique to other process levels. A dense array of openings at the window level, for example, can readily be decomposed into component patterns of less complexity, which can be used in sequential exposure steps to achieve improved fidelity in the final resist image.

As mentioned before, this technique can be extended to include multi-step exposure using two or more reticle patterns. The order in which the component reticle patterns are used may or may not be important, depending on the specific pattern design requirements. References to first and second reticle patterns in previous discussions are illustrative only. In the preceding discussions, it is assumed that optimal exposure conditions be employed for each exposure step as in conventional lithographic processes. Depending on the complexities of the desired patterns, resist exposure dosage or developer conditions such as exposure dosage may also be adjusted accordingly to achieve improvements in image fidelity using various resist systems.

The invention claimed is:

1. A method of integrated circuit manufacture comprising:
    (a) forming a resist layer on a substrate; and
    (b) forming a completed pattern in the resist layer, the completed pattern having a first edge feature intersecting a second edge feature, step (b) including the steps of:
        (b1) exposing the resist with at least a first pattern to form the first edge feature; and
        (b2) exposing the resist with at least a second pattern to form the second edge feature, the first pattern and the second pattern forming the completed pattern in the resist.

2. A method as in claim 1 wherein:
    the completed pattern has at least one corner feature defined by a first boundary and a second boundary,
    step (b1) further comprises the step of forming the first boundary, and
    step (b2) further comprises the step of forming the second boundary.

3. A method as in claim 1 wherein:
    the completed pattern has a first pattern feature and a second pattern feature adjacent to the first pattern feature,
    step (b1) further comprises the step of forming the first pattern feature, and
    step (b2) further comprises the step of forming the second pattern feature.

4. A method as in claim 3 wherein the first pattern feature and the second pattern feature are separated from each other.

5. A method as in claim 1 wherein the resist is a positive resist.

6. A method as in claim 1 wherein the resist is a negative resist.

7. A method as in claim 1 wherein there are only two exposing steps.

8. A method as in claim 1 wherein there are more than two exposing steps.

9. A method as in claim 1 wherein:
    the completed pattern has at least a first feature and a second feature substantially parallel to the first edge feature; and
    step (b1) further comprises the step of forming the first feature, and
    step (b2) further comprises the step of forming the second feature.

10. A method as in claim 9 wherein the first feature and the second feature are separated by an area.

11. A method as in claim 9 wherein a distance between the first feature and the second feature is less than one (1) micrometer.

12. A method as in claim 9 wherein step (b2) is performed prior to developing the resist.

13. A method as in claim 1 wherein step (b1) includes forming the first pattern using a first reticle having a first spatial spatial frequency and step (b2) includes forming the second pattern using a second reticle having a second spatial frequency where the first and second spatial frequencies are less than a spatial frequency of a reticle to form the completed pattern in one exposure step.

14. A method as in claim 1 further comprising the step of developing the completed pattern.

15. A method as in claim 14 further comprising one of the steps of doping, etching, and forming layers, to produce the integrated circuit.

16. A method of integrated circuit manufacture comprising:

(a) forming a resist layer on a substrate; and (b) exposing the resist with at least a first pattern to form a first edge feature and a second edge feature;

(c) exposing the resist with at least a second pattern to form a third edge feature intersecting the first edge feature and the second edge feature.

17. The method of claim 16 further comprising:

forming a first resist pattern using at least the first edge feature and the second edge feature, the first resist pattern having a first side, a second side, and a portion positioned between the first side and the second side; and forming a second resist pattern using at least the third edge feature, the second pattern overlaying the first side, the second side and the portion.

18. The method of claim 17 further comprising:

forming the second resist pattern to extend beyond the first side and the second side into a first area adjacent to the first side and a second area adjacent the second side, the first area and the second area located in an area other than between the first side and the second side.

* * * * *